(12) United States Patent
Agrawal et al.

(10) Patent No.: US 10,672,465 B1
(45) Date of Patent: Jun. 2, 2020

(54) NEUROMORPHIC MEMORY DEVICE

(71) Applicant: GLOBALFOUNDRIES Inc., Grand Cayman (KY)

(72) Inventors: Amogh Agrawal, West Lafayette, IN (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/388,607

(22) Filed: Apr. 18, 2019

(51) Int. Cl.
| | |
|---|---|
| *G11C 11/00* | (2006.01) |
| *G11C 11/54* | (2006.01) |
| *G11C 14/00* | (2006.01) |
| *G06N 3/00* | (2006.01) |
| G11C 11/417 | (2006.01) |
| G11C 11/16 | (2006.01) |
| G11C 11/412 | (2006.01) |

(52) U.S. Cl.
CPC .............. *G11C 11/54* (2013.01); *G06N 3/004* (2013.01); *G11C 14/0081* (2013.01); *G11C 11/1659* (2013.01); *G11C 11/1675* (2013.01); *G11C 11/412* (2013.01); *G11C 11/417* (2013.01)

(58) Field of Classification Search
CPC ....... G11C 14/009; G11C 5/06; G11C 13/003; G11C 2213/79
See application file for complete search history.

(56) References Cited

U.S. PATENT DOCUMENTS

| | | | | | |
|---|---|---|---|---|---|
| 3,389,383 | A | * | 6/1968 | Burke | ................... G11C 11/412 365/154 |
| 4,734,886 | A | * | 3/1988 | Blankenship | .......... G11O 5/063 365/104 |
| 9,779,795 | B1 | * | 10/2017 | Sadd | ................... G11C 11/1673 |
| 9,953,726 | B1 | * | 4/2018 | Irby | ................. G11C 29/50008 |
| 2014/0050012 | A1 | * | 2/2014 | Guillemenet | ........... G11C 11/16 365/148 |
| 2017/0062049 | A1 | * | 3/2017 | Roy | .................... G11C 13/0069 |
| 2018/0122462 | A1 | * | 5/2018 | Lee | ........................ G11C 11/161 |

OTHER PUBLICATIONS

Jiang et al., "Constructing Large and Fast Multi-Level Cell STT-MRAM based Cache for Embedded Processors," 2012 ACM.
Ma, "Novel Multi-bit Non-Volatile SRAM Cells for Runtime Reconfigurable Computing," 2015 IEEE.
Yamamoto and Sugahara, "Nonvolatile Static Random Access Memory Using Magnetic Tunnel Junctions with Current-Induced Magnetization Switching Architecture," Jpn, J. Appl. Phys., 48, 2009.

* cited by examiner

*Primary Examiner* — Tuan T Nguyen
(74) *Attorney, Agent, or Firm* — Amerson Law Firm, PLLC (57) ABSTRACT

One illustrative device includes, among other things, a first resistive storage element; a second resistive storage element; and logic to couple the first resistive storage element and the second resistive storage element in a series arrangement in a first configuration and to couple the first resistive storage element and the second resistive storage element in a parallel arrangement in a second configuration.

20 Claims, 6 Drawing Sheets

NEUROMORPHIC MEMORY DEVICE

BACKGROUND

Field of the Disclosure

Generally, the present disclosure relates to semiconductor devices, and, more specifically, to various novel neuromorphic memory devices and methods of operating the neuromorphic memory devices.

Description of the Related Art

Neuromorphic computing attempts to use very-large-scale integration (VLSI) systems containing electronic digital/analog circuits to mimic neuro-biological architectures present in the nervous system. The term neuromorphic, or brain-like, relates to analog, digital, mixed-mode analog/digital VLSI, and software systems that implement models of neural systems. Implementing neuromorphic computing on the hardware level can be difficult due to the nature of the memory devices employed. For example, conventional memory devices realized by transistors have only two states, on or off. This model differs significantly from the characteristics of actual synaptic connections in the brain. Neuromorphic circuits require an analog multi-level synaptic device, which can be used in a crossbar architecture to perform efficient neural computations. However, most analog storage devices present today are prone to write-errors and suffer from endurance issues. Such analog storage devices also cannot be used as conventional digital memories due to their high error rates, high writing energy, and low sensing margin, compared to current digital memory systems.

SUMMARY

The present disclosure is directed to various novel neuromorphic memory devices and methods of operating the neuromorphic memory devices that may solve or reduce one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a various novel neuromorphic memory devices and methods of operating the neuromorphic memory devices. One illustrative device includes, among other things, a first resistive storage element; a second resistive storage element; and logic to couple the first resistive storage element and the second resistive storage element in a series arrangement in a first configuration and to couple the first resistive storage element and the second resistive storage element in a parallel arrangement in a second configuration.

Another illustrative device includes, among other things, a memory cell, a first resistive storage element, a second resistive storage element, a first source line, a second source line, a first routing transistor having a first source/drain coupled to the first resistive storage element, a second source/drain coupled to the first source line, and a gate coupled to the memory cell, and a second routing transistor having a first source/drain coupled to the second resistive storage element, a second source/drain coupled to the second source line, and a gate coupled to the memory cell.

One illustrative method includes, among other things, coupling a first resistive storage element to a second resistive storage element in a memory cell to a selected one of a series arrangement in a first configuration or a parallel configuration in a second configuration, wherein the memory cell has a plurality of resistance states based on data stored in the first resistive storage element and the second resistive storage element and the selected first configuration or second configuration, and reading the memory cell to generate a current related to a particular resistance state of the plurality of resistance states.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

Figure 1:
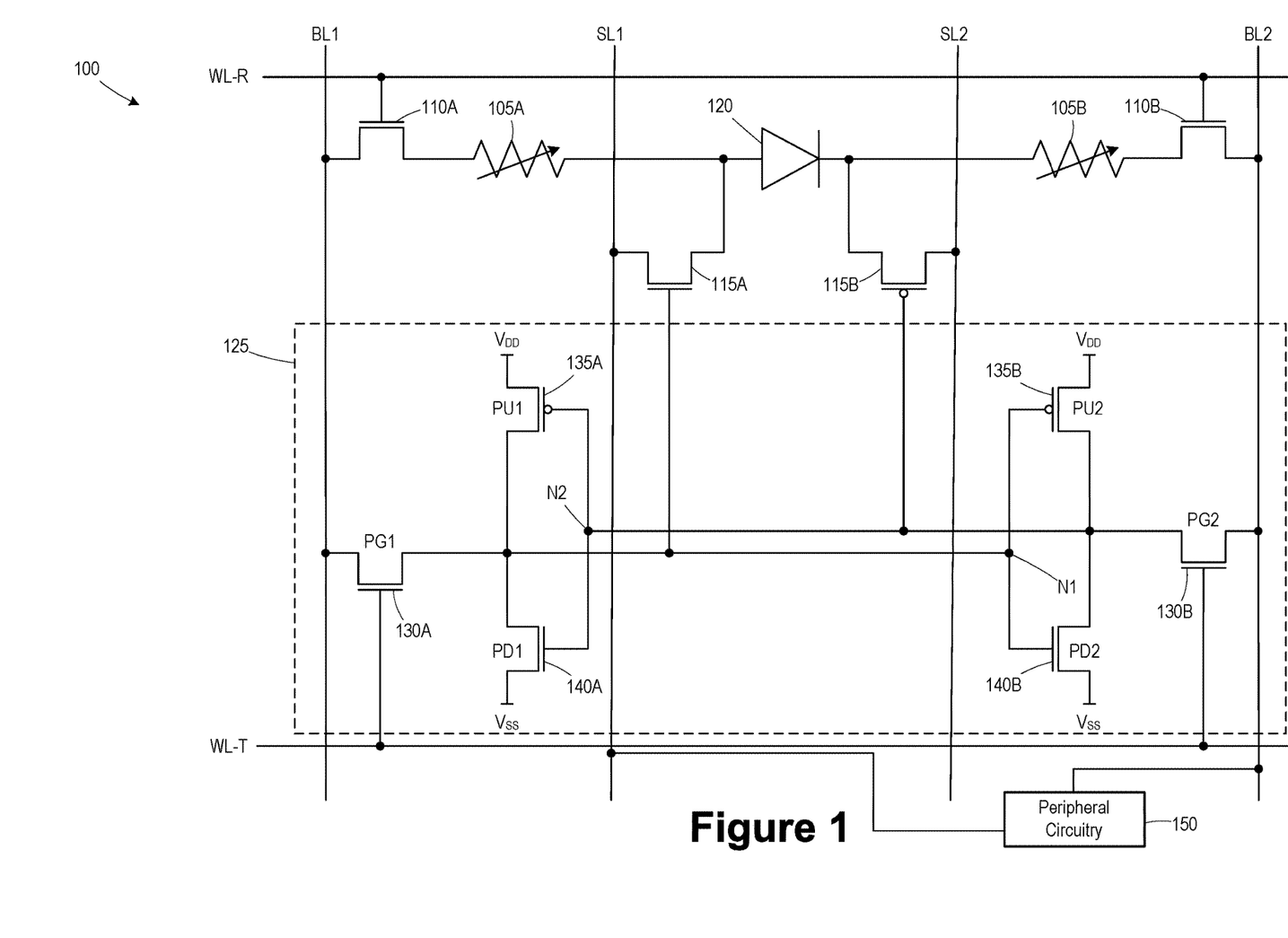
FIG. 1 is a circuit diagram of a neuromorphic memory device, according to some embodiments.

FIG. 1 is a circuit diagram of a neuromorphic memory device 100, according to some embodiments described herein. The neuromorphic memory device 100 includes resistive storage elements 105A, 105B, access transistors 110A, 110B, routing transistors 115A, 115B, a diode 120, and a storage element 125. In some embodiments, the storage element 125 is a volatile memory element, and the resistive storage elements 105A, 105B are non-volatile storage elements. The storage element 125 and the routing transistors 115A, 115B define routing logic for the resistive storage elements 105A, 105B. The storage element 125 selectively enables the routing transistors 115A, 115B to change the circuit orientation of the resistive storage elements 105A, 105B. In some embodiments, when a logic "1" is stored in the storage element 125, the routing transistors 115A, 115B are both enabled, and the resistive storage elements 105A, 105B are connected in parallel, and when a logic "0" is stored in the storage element 125, the routing transistors 115A, 115B are both disabled and the resistive storage elements 105A, 105B are connected in series through the diode 120. As a result, the neuromorphic memory device 100 has multiple resistance states, or analog states, depending on the data stored in the storage element 125 and the orientation of the resistive storage elements 105A, 105B.

In some embodiments, the resistive storage elements 105A, 105B are spin-transfer torque magnetic random access memory (STT-MRAM) devices. An STT-MRAM element includes a reference layer and a free layer separated by a barrier layer. A magnetic field of the reference layer is fixed. A magnetic field of the free layer is modulated to define the state of the memory element. The STT-MRAM element has a parallel, or low resistance (LR), state when the magnetic fields of the reference layer and the free layer are aligned, and an anti-parallel, or high resistance (HR), state when the magnetic fields of the reference layer and the free layer are opposite one another.

In some embodiments, the storage element 125 is an SRAM cell including NMOS pass gate transistors 130A, 130B (PG1/PG2), PMOS pull-up transistors 135A, 135B (PU1/PU2), and NMOS pull-down transistors 140A, 140B (PD1/PD2). The source/drain region of the pass gate transistor 130A is cross-coupled to the gates of the pull-up transistor 135B and the pull-down transistor 140B to define a first storage node N1. The source/drain region of the pass gate transistor 130B is cross-coupled to the gates of the pull-up transistor 135A and the pull-down transistor 140A to define a second storage node N2. Although the various transistors in the storage element 125 are illustrated as being N or P type devices, it is contemplated that complementary devices may be used and logic signals may be inverted accordingly to achieve the same logical results.

A first word line WL-R is connected to gates of the access transistors 110A, 110B. First source/drain regions of the access transistors 110A, 110B are connected to bit lines BL1, BL2, respectively, and second source/drain regions of the access transistors 110A, 110B are connected to the resistive storage elements 105A, 105B, respectively. Source lines SL1, SL2 are connected to outputs of the resistive storage elements 105A, 105B, respectively.

In some embodiments, the access transistors 110A, 110B, the routing transistors 115A, 115B, and the transistors 130A, 130B, 135A, 135B, 140A, 140B in the storage element 125 are metal oxide semiconductor (MOS) transistors, each including a gate or control terminal, a first source/drain (S/D) terminal, and a second source/drain (S/D) terminal. In some embodiments, the access transistors 110A, 110B, the routing transistors 115A, 115B, and the transistors 130A, 130B, 135A, 135B, 140A, 140B are planar devices, such as planar semiconductor-over-insulator (SOI) devices. In some embodiments, the routing transistors 115A, 115B, and the transistors 130A, 130B, 135A, 135B, 140A, 140B are Fin-FET devices, gate-all-around (GAA) devices, or other suitable structures.

In some embodiments, peripheral circuitry 150 at the edge of the array sums the current on SL1 and BL2 to detect the resistance state. In some embodiments, SL1 and BL2 are shorted outside the array to sum the current.

Table 1 illustrates the resistance states of the neuromorphic memory device 100 for different orientation states of the resistive storage elements 105A, 105B and states of the storage element 125. Consider that the resistive storage elements 105A, 105B have a resistance of R1 in the LR state and a resistance of R2 in the HR state.

TABLE 1

Resistance States for Neuromorphic Memory Device

| State | Storage Element State | Resistive Storage Element Orientations | Resistance |
|---|---|---|---|
| 1 | 0 - Parallel | LR/LR | $\dfrac{R1}{2}$ |
| 2 | 0 - Parallel | LR/HR | $\dfrac{R1 * R2}{R1 + R2}$ |
| 3 | 0 - Parallel | HR/HR | $\dfrac{R2}{2}$ |
| 4 | 1 - Series | LR/LR | 2 * R1 |
| 5 | 1 - Series | LR/HR | R1 + R2 |
| 6 | 1 - Series | HR/HR | 2 * R2 |

In the example of Table 1, the resistive storage elements 105A, 105B have the same low resistance and high resistance values. In some embodiments, the resistive storage elements 105A and 105B are fabricated/designed to each have different high and low resistance values, such as R1A, R2A for the resistive storage element 105A, and R1B, R2B for the resistive storage element 105B. In this embodiment, it is possible to obtain eight different resistance states.

Figure 2:
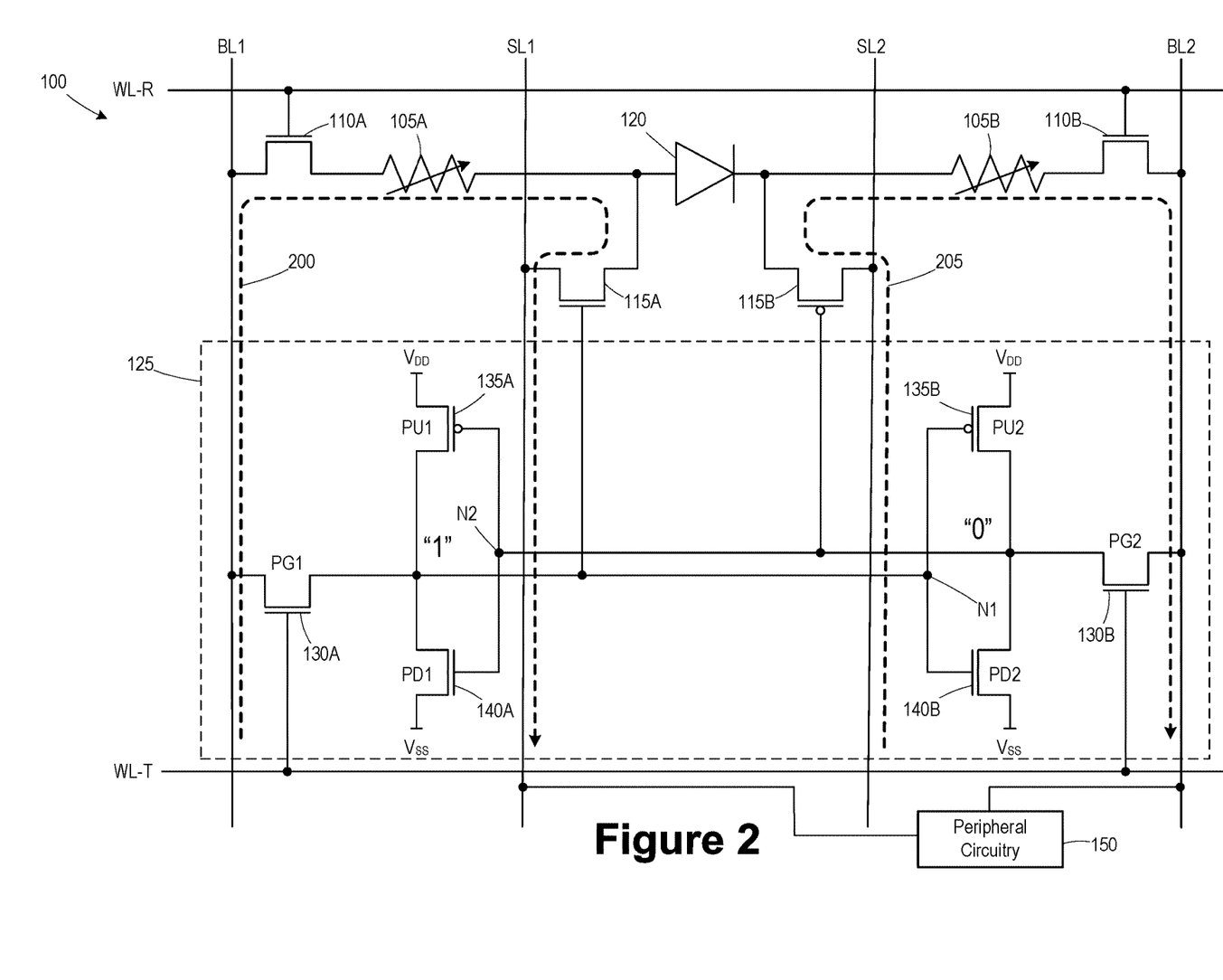
FIGS. 2 and 3 are circuit diagrams illustrating different configurations of the neuromorphic memory device of FIG. 1 to provide different analog states, according to some embodiments.

FIG. 2 illustrates current flow in the neuromorphic memory device 100 of FIG. 1 for the parallel configuration of the storage element 125 (i.e., logic "0"). The logic "0" in the storage element 125 results in a "1" at node N1, enabling the routing transistor 115A, and "0" at node N2, enabling the routing transistor 115B. A read voltage is applied at BL1 and SL2. A first current path 200 exists from BL1 through the access transistor 110A, the resistive storage element 105A, and the routing transistor 115A to the source line SL1. A second current path 205 exists from SL2 through the routing transistor 115B, the resistive storage element 105B, and the access transistor 110B to the bit line BL2. The diode 120 inhibits current flow between the source lines SL1, SL2.

Figure 3:
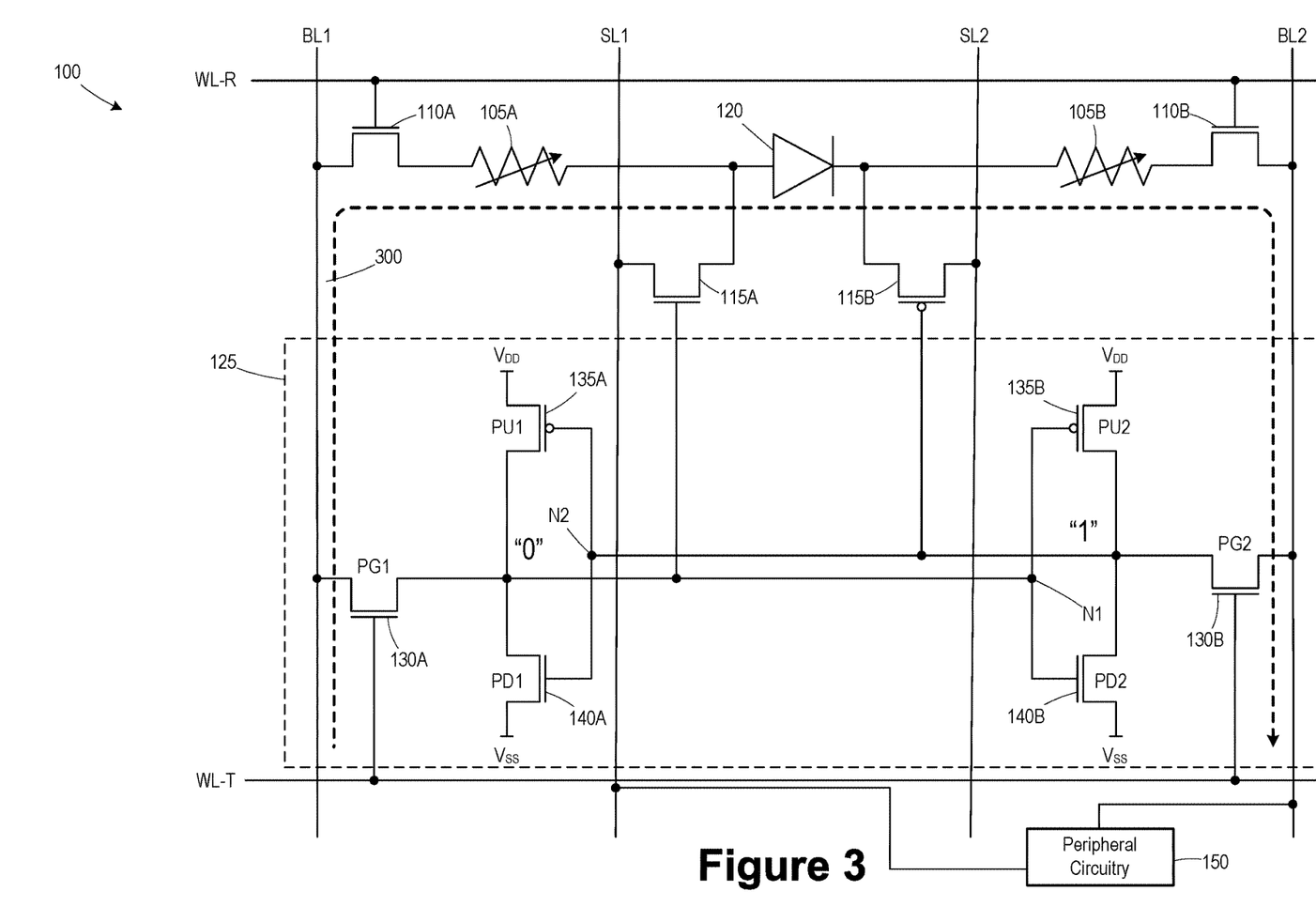

FIG. 3 illustrates current flow in the neuromorphic memory device 100 of FIG. 1 for the series configuration of the storage element 125 (i.e., logic "1") and the routing transistors 115A, 115B. The logic "1" in the storage element 125 results in a "0" at node N1, disabling the routing transistor 115A, and "1" at node N2, disabling the routing transistor 115B. A read voltage is applied at BL1 and SL2. A current path 300 exists from BL1 through the access transistor 110A, the resistive storage element 105A, the diode 120, the resistive storage element 105B, and the access transistor 110B to the bit line BL2.

The resistive state of the neuromorphic memory device 100 is read by enabling the word line, WL-R, applying a first voltage (e.g., $V_{DD}$) to the bit line BL1 and the source line SL2, applying a second voltage (e.g., $V_{SS}$) to the bit line BL2 and the source line SL1, and measuring current on the source line SL1 and the bit line BL2. The summed current from the lines SL1 and BL2 of the array is read. In some embodiments, where multiple cells are in a column using a crossbar arrangement, the current in SL1 and BL2 depends on how many cells along the column are in parallel and how many are in series. Note that the summed current is not just the state of one cell, but represents the dot-product output of the crossbar arrangement.

Write operations to the resistive storage elements 105A, 105B are performed by storing a logic "0" into the storage element 125 to provide a parallel configuration. Signals are provided on BL1 and SL1 to write to the resistive storage element 105A, and signals are provided on BL2 and SL2 to write to the resistive storage element 105B. For example, when writing to the resistive storage elements 105A, 105B, the voltage on BLx is greater than that on SLx to generate the LR state, and the voltage on SLx is greater than that on BLx to generate the HR state.

Figure 4:
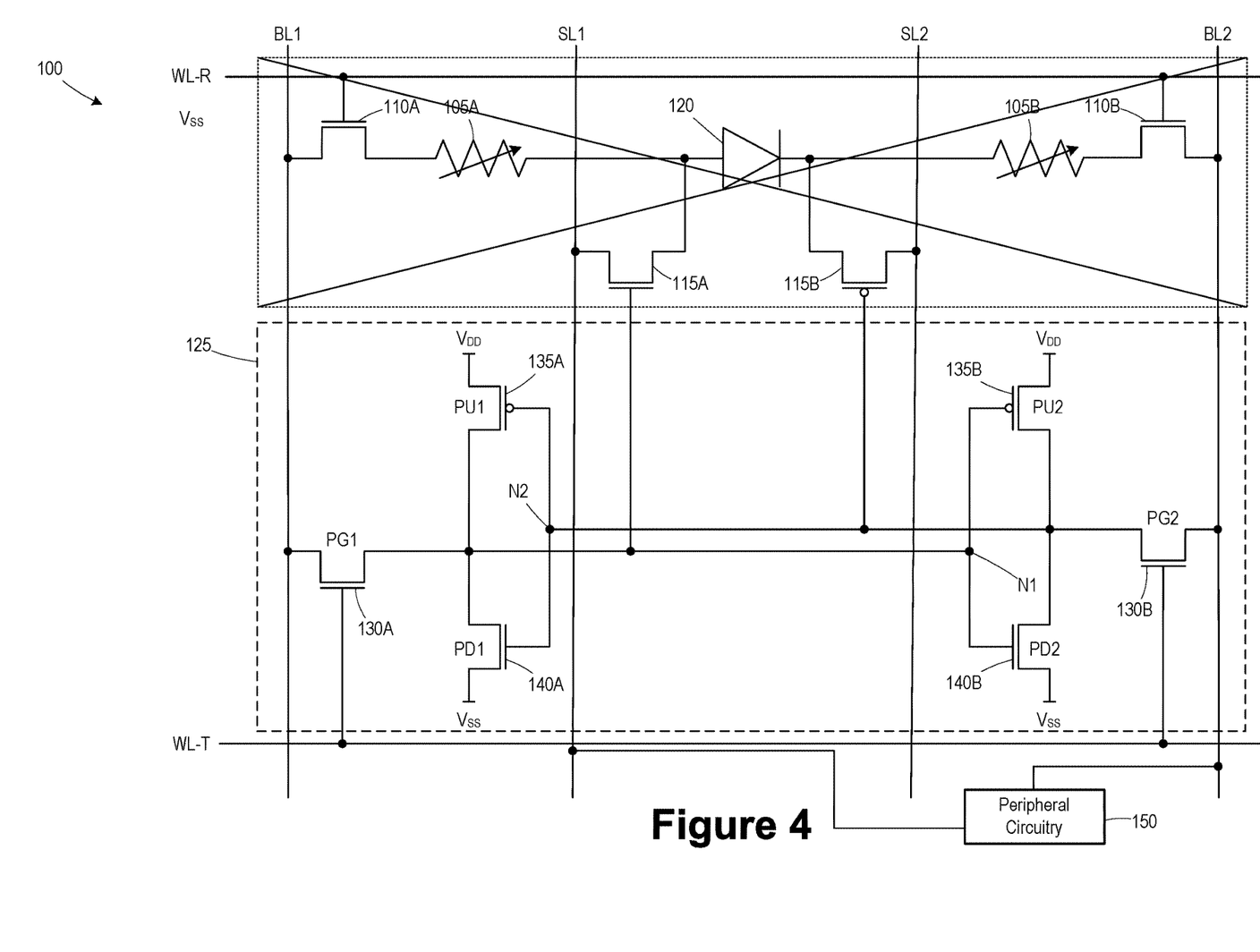
FIGS. 4-6 are circuit diagrams illustrating different memory modes of the neuromorphic memory device of FIG. 1, according to some embodiments.

In some embodiments, the neuromorphic memory device 100 of FIG. 1 is operated in different modes. FIGS. 1-3 illustrate operation in a neuromorphic mode. In some embodiments, as illustrated in FIG. 4, the neuromorphic memory device 100 is operated in an SRAM mode using the word line WL-T and the bit lines BL1, BL2. The resistive storage elements 105A, 105B are isolated by connecting the word line WL-R to $V_{SS}$.

Figure 5:
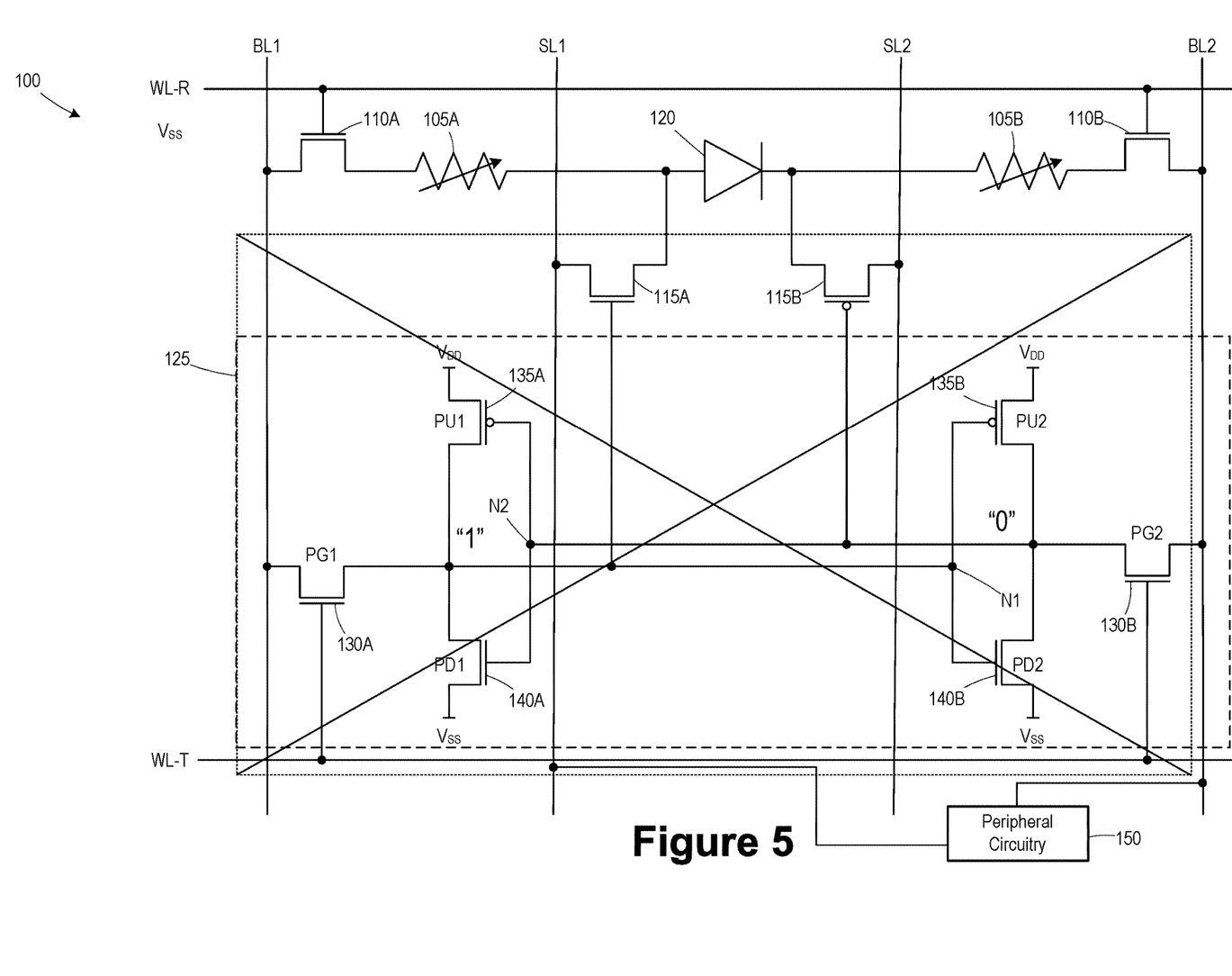

In some embodiments, as illustrated in FIG. 5, the neuromorphic memory device 100 is operated in a non-volatile memory (NVM) mode using the resistive storage elements 105A, 105B as separate cells using the associated access transistor 110A, 110B, the word line WL-R, the bit lines BL1, BL2, and the source lines SL1, SL2. In some embodiments, a logic "0" is written into the storage element 125 to enable the routing transistors 115A, 115B to connect the resistive storage elements 105A, 105B to the source lines SL1, SL2 allowing the resistive storage elements 105A, 105B to be read independently. Due to the diode 120, the resistive storage elements 105A, 105B are not written in parallel, but instead they are written using separate write operations. In some embodiments, a low-power NVM mode is implemented by removing power from the storage elopement, resulting in a logic "0" at both routing transistors 115A, 115B. Only the routing transistor 115B is enabled, allowing operation of the resistive storage element 105B as a stand-alone low-power NVM cell.

Figure 6:
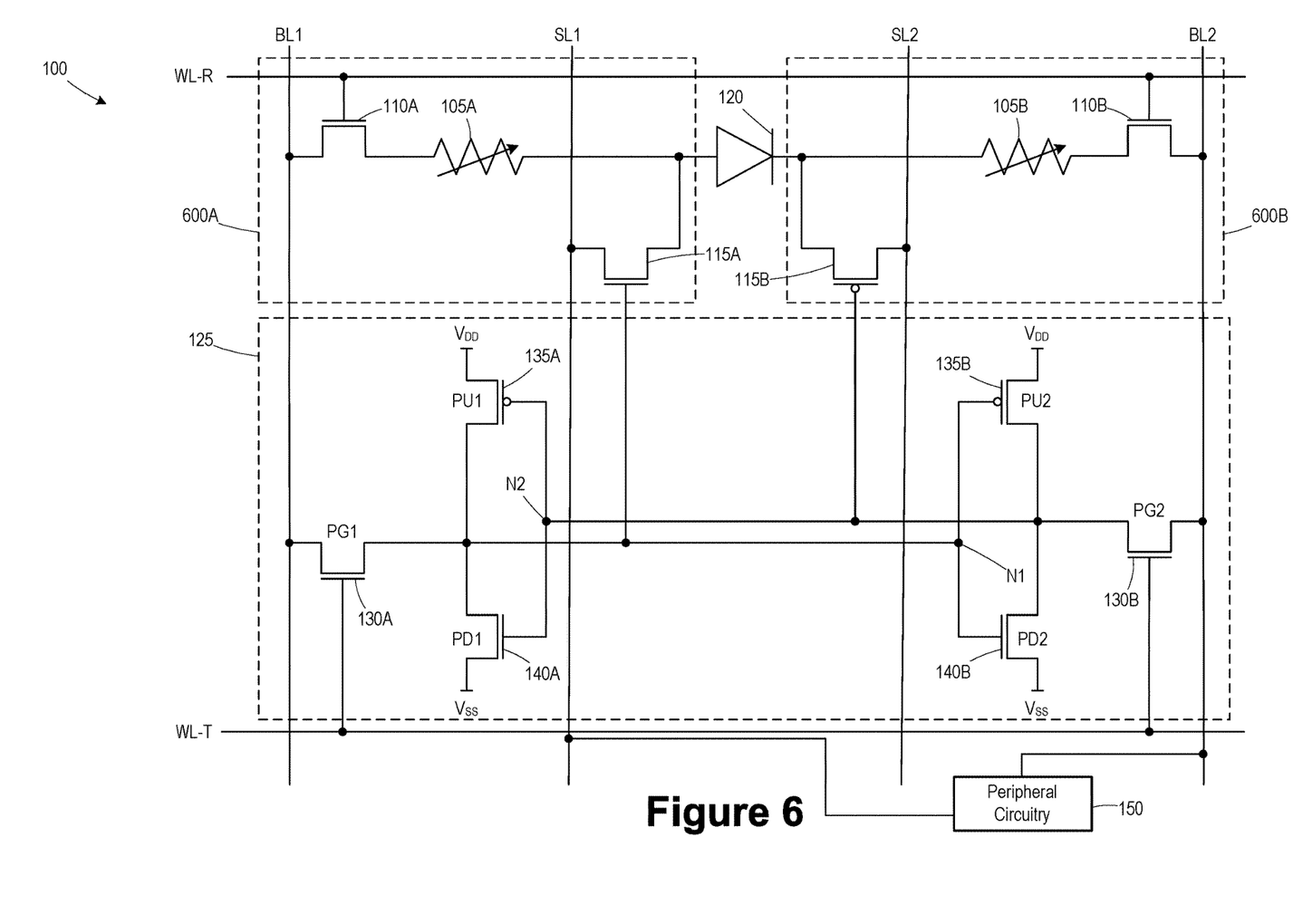

In some embodiments, as illustrated in FIG. 6, the neuromorphic memory device 100 is operated in a multi-bit mode, where the storage element 125 is operated as a separate SRAM cell, the resistive storage element 105A and the access transistor 110A are operated as a first NVM cell 600A, and the resistive storage element 105B and the access transistor 110B are operated as a second NVM cell 600B. The SRAM cell and the NVM cells 600A, 600B are read from and written to in separate operations.

The neuromorphic memory device 100 described herein has numerous advantages. The neuromorphic memory device 100 combines the advantages of robust digital storage elements with analog computing through the multi-level analog states. The discrete resistance states provide a good sense margin between states. Moreover, the neuromorphic memory device 100 can operate in a fast SRAM digital memory mode, a low-power NVM digital memory mode, or an analog neuromorphic memory mode, thereby acting as an on-demand accelerator for performing neural computing. The neuromorphic memory device 100 may be incorporated into a crossbar architecture for neuromorphic computing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

The invention claimed is:

1. A device comprising:
   a first resistive storage element;
   a second resistive storage element; and
   logic to couple the first resistive storage element and the second resistive storage element in a series arrangement in a first configuration and to couple the first resistive storage element and the second resistive storage element in a parallel arrangement in a second configuration.

2. The device of claim 1, further comprising:
   a first source line coupled to the first resistive storage element;
   a first bit line;
   a first access transistor having a first source/drain coupled to the first bit line and a second source/drain coupled to the first resistive storage element;

a second source line coupled to the second resistive storage element;
a second bit line; and
a second access transistor having a first source/drain coupled to the second bit line and a second source/drain coupled to the first resistive storage element.

3. The device of claim 2, further comprising a first word line coupled to gates of the first access transistor and the second access transistor.

4. The device of claim 3, wherein the logic comprises a storage element memory cell to store a first value to implement the first configuration and a second value to implement the second configuration.

5. The device of claim 4, further comprising a second word line coupled to the storage element.

6. The device of claim 4, wherein the logic comprises:
a first routing transistor having a first source/drain coupled to the first resistive storage element, a second source/drain coupled to the first source line, and a gate coupled to the storage element; and
a second routing transistor having a first source/drain coupled to the second resistive storage element, a second source/drain coupled to the second source line, and a gate coupled to the storage element.

7. The device of claim 6, wherein the storage element comprises a memory cell having a first node and a second node storing a complement of the first node, the gate of the first routing transistor is coupled to the first node, and the gate of the second routing transistor is coupled to the second node.

8. The device of claim 7, wherein the first routing transistor comprises an N-type transistor, and the second access transistor comprises a P-type transistor.

9. The device of claim 7, wherein the memory cell comprises a static random access memory cell.

10. The device of claim 2, further comprising peripheral circuitry to combine current on the first source line with current on the second bit line.

11. A device comprising:
a memory cell;
a first resistive storage element;
a second resistive storage element;
a first source line;
a second source line;
a first routing transistor having a first source/drain coupled to the first resistive storage element, a second source/drain coupled to the first source line, and a gate coupled to the memory cell; and
a second routing transistor having a first source/drain coupled to the second resistive storage element, a second source/drain coupled to the second source line, and a gate coupled to the memory cell.

12. The device of claim 11, further comprising;
a first bit line;
a second bit line;
a first access transistor having a first source/drain coupled to the first bit line and a second source/drain coupled to the first resistive storage element; and
a second access transistor having a first source/drain coupled to the second bit line and a second source/drain coupled to the first resistive storage element.

13. The device of claim 12, wherein the memory cell comprises a first node and a second node storing a complement of the first node.

14. The device of claim 12, wherein the first routing transistor comprises an N-type transistor, and the second access transistor comprises a P-type transistor.

15. The device of claim 12, wherein the memory cell comprises a static random access memory cell.

16. The device of claim 11, further comprising peripheral circuitry to combine current on the first source line with current on the second bit line.

17. A method, comprising:
coupling a first resistive storage element to a second resistive storage element in a memory cell to a selected one of a series arrangement in a first configuration or a parallel configuration in a second configuration, wherein the memory cell has a plurality of resistance states based on data stored in the first resistive storage element and the second resistive storage element and the selected first configuration or second configuration; and
reading the memory cell to generate a current related to a particular resistance state of the plurality of resistance states.

18. The method of claim 17, wherein the plurality of resistance states comprises between six and eight resistance states.

19. The method of claim 17, wherein coupling the first resistive storage element to the second resistive storage element comprises configuring a storage element to store a first value corresponding to the first configuration and to have a second value corresponding to the second configuration.

20. The method of claim 19, further comprising controlling a first routing transistor coupled to the first resistive storage element and a second routing transistor coupled to the second resistive storage element based on the first value or the second value stored in the storage element.

* * * * *